United States Patent [19]

Otsubo et al.

[11] Patent Number: 4,985,109

[45] Date of Patent: Jan. 15, 1991

[54] APPARATUS FOR PLASMA PROCESSING

[75] Inventors: Toru Otsubo, Fujisawa; Mitsuo Tokuda, Tachikawa; Yasuhiro Yamaguchi, Chigasaki; Ichirou Sasaki; Kazuhiro Ohara, both of Yokohama; Hirohisa Usuami, Fuchu; Junzou Azuma, Yokohama, all of Japan

[73] Assignee: Hitachi, Ltd., Tokyo, Japan

[21] Appl. No.: 475,889

[22] Filed: Feb. 6, 1990

[30] Foreign Application Priority Data

Feb. 8, 1989 [JP] Japan ................................. 1-27406

[51] Int. Cl.$^5$ ..................... B44C 1/22; C03C 15/00; C03C 25/06

[52] U.S. Cl. ................................. 156/345; 118/728; 118/50.1; 118/620; 156/643; 204/298.38; 427/38

[58] Field of Search ................... 204/192.32, 192.37, 204/298.38; 156/345, 643, 646; 427/38, 39; 118/728, 50.1, 620

[56] References Cited

U.S. PATENT DOCUMENTS 4,776,918 10/1988 Otsubo et al. .................. 156/345

Primary Examiner—Wm. A. Powell

Attorney, Agent, or Firm—Antonelli, Terry, Stout & Kraus

[57] ABSTRACT

A plasma processing apparatus including a microwave generator, a waveguide for supplying microwaves generated by the microwave generator, a cavity resonator for resonating the microwaves supplied by the waveguide, and a plasma processing chamber. The plasma processing chamber is coupled to the cavity resonator for receiving resonated microwaves therefrom and for generating a plasma therein. The plasma processing chamber is provided with a stage for holding a substrate for plasma processing, and apparatus for introducing a plasma processing gas to the plasma processing chamber for exhausting gas therefrom. A separation plate separates the cavity resonator and the plasma processing chamber and enables resonated microwaves to be transmitted therethrough from the cavity resonator means to the plasma processing chamber. A slot plate functioning as an antenna is disposed in the cavity resonator in opposition to a surface of the substrate for enabling radiation of the resonated microwaves to the plasma processing chamber through the separation plate, the slot plate including at least one set of circumferentially extending slots for enabling radiation of resonated microwaves.

49 Claims, 11 Drawing Sheets

DIRECTION OF SURFACE CURRENT

APPARATUS FOR PLASMA PROCESSING

BACKGROUND OF THE INVENTION

The present invention relates to manufacturing of semiconductor elements using low-temperature plasma, and more particularly to a microwave plasma processing apparatus of a cavity resonance system favorable for processings such as etching, CVD, ashing or the like.

Processing such as etching, CVD, sputtering or the like using microwave plasma become indispensable technology to fine pattern forming and film forming of semiconductor elements.

Plasma generation by microwaves is broadly classified into two systems. One is an ECR (Electron Cyclotron Resonance) system using a resonance phenomenon combining frequency of cyclotron motion where electrons are moved in rotational motion on a plane perpendicular to a magnetic field and frequency of microwaves, and the other is cavity resonance system where electric field intensity of microwaves is strengthened by a cavity resonator, and free electrons existing in the space are accelerated by the strong electric field whereby plasma is generated. The former system is disclosed in Japanese patent application Laid-Open No. 13480/1981 and No. 155535/1981, and further improvement thereof is disclosed in Japanese patent application laid-open No. 13575/1987. The latter system is disclosed in Japanese patent application Laid-Open No. 96841/1981, and further improvement thereof is disclosed in Japanese patent application Laid-Open No. 103088/1988. Problems to be Solved by the Invention When the ECR system is used, since energy of microwave is transferred to electons by the resonance phenomenon, the electric field intensity of the microwave required for generation and maintaining of plasma may be weak. In the ECR system, however, since a magnetic field is required, a problem exists in that improvement of uniformity of the plasma is difficult.

The cavity resonance system is a system to solve this problem and is also disclosed in U.S. Pat. No. 4,776,918 wherein a cavity resonator is separated from a plasma production chamber by a ceramic or quartz plate and a slit plate is provided. However, also in this cavity resonance system sufficient consideration has not been given to ensuring that the plasma is processed uniformly and stably.

SUMMARY OF THE INVENTION

It is an object of the present invention to provide a plasma processing apparatus of cavity resonance system where processing such as CVD, etching, ashing or the like can be performed uniformly throughout the whole surface of the substrate utilizing diffusion of plasma.

Another object of the present invention is to provide a plasma processing apparatus of a cavity resonance system where generated plasma can be maintained stably, and processing such as CVD, etching, ashing or the like can be performed stably.

A further object of the present invention is to provide a plasma processing apparatus of a cavity resonance system where generation of plasma is stabilized and processing such as CVD, etching, ashing or the like can be performed with good reproducibility.

In accordance with the present invention a plasma processing apparatus of a cavity resonance system comprises a microwave oscillator, a waveguide for introducing microwaves from the microwave oscillator, a cavity resonator for performing resonance of the microwave introduced by the waveguide, a plasma processing chamber provided with a stage to hold a substrate for the plasma processing and connected to an exhaust device and a gas introducing device to introduce the plasma processing gas, a separation plate for transmitting the microwaves subjected to resonance by the cavity resonator and for separating the cavity resonator and the plasma processing chamber, and a slot plate functioning as an antenna and disposed in the cavity resonator so as to be opposed to the substrate surface for radiating the microwaves subjected to resonance by the cavity resonator and forming a slot of small width with the longitudinal direction directed to the circumferential direction, wherein the microwaves radiated from the slot of the slot plate are supplied to the plasma processing gas introduced in the plasma processing chamber so as to generate plasma, and the generated plasma acts on the substrate uniformly by double polarity diffusion.

According to a feature of the present invention the slot plate forms a slot of small width in a single or double structure with the longitudinal direction directed to the circumferential direction, and the center position of anm outside slot is disposed outwardly with respect to the outer circumferential position of the substrate.

In accordance with another feature of the present invention, the slot plate forms a set of slots of small width with the longitudinal direction directed to the circumferential direction, a diameter of the set of slots of the slot plate being 0.75-3 and preferably 1-3 times the distance between the substrate and the separation plate.

According to a further feature of the present invention, the slot plate forms slots delimiting a cross-sectional area of 5-130 $cm_2$ so as to enable microwave power density radiated from the slots to be 1 $W/cm_2$ or more, and the plasma processing gas introduced in the plasma processing chamber by the microwaves radiated from the slots of the slot plate are ignited to enable the plasma to be generated.

According to other features of the present invention, when the slots of the slot plate are arranged in plural structure, a width dimension in the radial direction of the inside slot is formed narrow in comparison to that of the outside slot so that the uniformity of the plasma to the substrate is improved. Further, with the slots of plural structures, a ratio of opening area of the inside slot to the opening of the outside slot is made less than a ratio of the diameter of the set of inside slots to diameter of the set of outside slots so that the uniformity of the plasma to the substrate is improved.

In accordance with the present invention, a plasma apparatus of a cavity resonance system is provided with a magnetic field forming arrangement installed in the vicinity of the slot plate s that electrons existing in the space to the vicinity of the slot ar accelerated by the microwaves radiated from the slot and the diffusion phenomenon to the substrate surface is not lost.

According to features of the present invention, there are provided control of the opening amount of the slots of the slot plate control of the microwave power, control of modulation of the microwave, or setting of the plasma processing chamber to the cavity resonance condition, at the ignition state to generate plasma and at maintaining the plasma later.

According to other features of the present invention, a plasma processing apparatus of a cavity resonance system has a stub tuner installed to the waveguide so that the impedance of microwaves to be inputted to the cavity resonator can be adjusted. Also, the mode of the cavity resonator is the E mode so that radiation performance of the microwaves are improved. Additionally, a number of blow-off ports of the plasma processing gas of the gas introducing arrangement connected to the plasma processing chamber are provided on the upper outside of the substrate in a nearly uniform pitch so that a CVD film can be formed uniformly on the substrate. The number of blow-off ports of the plasma processing gas of the gas introducing arrangement connected to the plasma processing chamber may alternatively be provided on the lower outside of the substrate in a nearly uniform pitch, and a bias voltage device for applying bias voltage to the stage being provided so that etching processing can be performed uniformly to the substrate.

A plasma processing apparatus of a cavity resonance system in accordance with the present invention includes a heater for heating the substrate so that a CVD film of good quality can be formed on the substrate. Further, a cooling device for cooling the substrate may be provided, and a bias voltage device for applying bias voltage to the stage being provided s that etching processing can be performed without causing damage to the substrate.

In the case of the cavity resonance system of the present invention, when there is no magnetic field, diffusion of the plasma is large and uniformization is easy. However, microwaved scarcely travel in the plasma of high density ($10^{10}$-$10^{11}$, cm$^{-3}$) but are absorbed by the plasma in the vicinity of the supplied portion. That is, the angular frequency $\omega p$ of the plasma oscillation is given as follows.

$$\omega p = 4\pi n.e^2/me$$

n.: electron density of plasma
e: electron charge
me: mass of electron

Consequently, when the electric field of the angular frequency $\omega$ is applied from the outside, under the condition of $\omega < \omega p1$, the electric field from the outside is eliminated by moving of electrons and cannot be propagated in the plasma. For example, microwaves of 2.45 GHz are not propagated in the plasma with plasma density being $n.=7.6\times10^{10}$ cm$^{-3}$ or more, but are absorbed by the plasma in the vicinity of the slot whereby the vicinity of the slot may be made the generating source of the plasma. In the present invention, since there is no magnetic field and diffusion of the plasma becomes double polarity diffusion, the plasma spreads in the double polarity diffusion from the plasma generating source in the vicinity of the slot and disappears at the inner wall surface of the plasma processing chamber and the substrate surface. The double polarity diffusion Da representing characteristics of the double polarity diffusion is given by following formula.

$$Da = \mu i\, (kTe/e) \quad (2)$$

$\mu i$: ion mobility
k: Boltzmann's constant
Te: absolute temperature of electron
e: electron charge Based on the above-mentioned principle, in order to generate the plasma of good uniformity, the present invention provides for supply of the microwaves so that the plasma becomes uniform by the double polarity diffusion.

According to the present invention as above described, since plural slender slots in single or double structure are opposed to the substrate surface and formed with the longitudinal direction directed to the circumferential direction and the center position of the outside slot is disposed outwardly with respect to the outer circumferential position of the substrate, the plasma from the vicinity of the slot are the generating source is diffused in double polarity diffusion and acts on the substrate surface, whereby uniformity of about 10% to the whole or entire surface of the substrate can be obtained in a CVD apparatus with the distance G between the substrate and the separation plate being 80 mm or more or in an etching apparatus not requiring much ion quantity.

According to another construction of the present invention as above described, since slender slots are opposed to the substrate surface and formed with the longitudinal direction directed to the circumferential direction and the diameter D of the slot of the outermost circumference is formed in 0.75-3 times of the distance G between the substrate and the separation plate ($D=(0.75-3)\times G$), that is, as the distance G between the substrate and the separation plate becomes large in range of 30-300 mm, the diameter D of the slot of the outermost circumference is enlarged from relation of $D=(0.75-3)\times G$, the plasma from the vicinity of the slot as the generating source is diffused in the double polarity diffusion and acts on the surface of the substrate, whereby uniformity of about 15% to the whole surface of the substrate can be obtained.

When the microwave is subjected to resonance by the cavity resonator, a phenomenon occurs that the surface current flowing through the resonator is different depending on location. In the slots as shown in FIG. 2, the small width direction is provided in the orthogonal direction to the surface current, and the charge of the surface current is stored on both ends of the slot and varied in the frequency of the microwaves whereby the electric field generated between both ends of the slot is varied and the microwaves are radiated. Consequently, the radiated microwave power is proportional to the surface current density. This causes no problem in the case that the current density in the position of providing the slots is equal as shown in FIG. 2, but indicates that values of the microwave power radiated in the inside slot and the outside slot are different when the slots become a double structure and the inside slot and the outside slot are different in the surface current density. Consequently, in the slot constitution of double or triple structure, corresponding to the surface current density depending on the slot position, length of the slot, thickness of the slot plate, width of the slot and the like are varied and the microwave power radiated from each slot is made equal, or the microwave power radiated from the inside slot is made little in comparison to that radiated from the outside slot, whereby the plasma density can be made uniform throughout the whole surface of the substrate. That is, since the partial surface area of the substrate is expressed by $\Delta S = 2\pi r dr$ and further the microwave power is radiated in the strength of about sin $\theta$ for the radiation angle $\theta$ to the vertical axis of the generating source, the plasma density becomes high in proportion to coming to the center of the substrate, whereby the microwave power radiated from the inside slot may be made significantly small. However, the surface current density becomes large in proportion to coming to the center of the slot plate, and the inside slot is effective to ignite the plasma. I order that the plasma is ignited and then the generated plasma is maintained, much microwave power need not be radiated from the inside slot.

A mechanism of starting the discharge and generating the plasma is as follows. Even if the plasma is not generated, the gas includes free electrons although in a small quantity not bound by the atomic nucleus. The free electrons are supplied with energy from the electric field of the impressed microwaves and accelerated and collide with the gas molecules, whereby the electrons are ionized and at the same time produce new free electrons. This process is repeated whereby the ions and the electrons are increased in number, and on the other hand these electrons disappear on arriving to the wall surface. Consequently, if the increase of electrons exceeds the disappearance, the discharge is continued, and in the reverse case, the discharge does not occur. Consequently, in the case of the cavity resonator system of the present invention, it is inevitable for generation and maintaining of the plasma that the electric field intensity of the microwave determined by the microwave power per the opening area receiving the supplied microwaves are strengthened and electrons are accelerated efficiently and increased in number. In the present invention, the area of the slot is made 5–130 $cm^2$ and the microwave power density radiated from the slot is made 1 $W/cm^2$ or more, whereby the microwaves can be absorbed by the plasma efficiently and the generated plasma can be maintained and the plasma processing can be performed stably. In this case, if an opening of slot shape is provided nearly in the orthogonal direction to the surface current of the slot plate of the cavity resonator, since the current is cut by the slot, the charge is stored at both ends of the slot and varied in the frequency of the microwaves, whereby the radiation impedance is decreased to 20 $k\Omega$ or less and the microwave can be radiated from the slot efficiently. Particularly, if the opening area of the slot is made 5 $cm^2$ or less, the radiation impedance to the plasma processing chamber of the microwave becomes as large as 20 $k\Omega$ or more due to the slot, whereby the stage number of the stub tuner must be increased and its realization is problematic and the reflected microwaves become large and the microwaves cannot be radiated from the slot efficiently. Thus the radiation impedance of the microwaves is determined by the shape of the slot, the direction or the like.

Also when a magnetic field forming apparatus such as a magnet is installed in the vicinity of the slot plate, electrons existing in the space to the vicinity of the slot are accelerated by the microwaves radiated from the slot so that efficiency of ionization by electrons is improved and generation of the plasma can be stabilized. That is, once the plasma is generated, since the microwaves radiated from the slot are absorbed efficiently by many electrons existing in the vicinity of the slot, the discharge can be maintained stably. However, since electrons existing before generation of the discharge are small in number, the microwave from the slot are scarcely absorbed, but spread.

Consequently, the electric field intensity of the microwaves in the vicinity of the slot is in the strengthened state, but in a slightly remote position from the slot, since the microwaves spread, the electric field intensity becomes weak and the electrons cannot be accelerated well. Consequently, the region capable of generating the plasma at the initial state becomes only the region in the vicinity of the slot, and an increase of the absorption of the microwaves in this region is necessary for the stable plasma generation.

In order to increase the absorption of the microwaves, it ia effective that free electrons existing in a small quantity and accelerated by the electric field of the supplied microwaves are confined to the vicinity of the slot by the magnetic field provided in the vicinity of the slot for decreasing the diffusion of electrons. In this arrangement, since the electrons are always accelerated by the electric field of the microwaves and neutral gas molecules are ionized in sequence and electrons are emitted, the plasma can be generated easily. Also when the microwave power before the plasma generation is increased, the region of the strong electric field intensity is enlarged. Thereby the free electrons existing in the space are accelerated, and further the probability of ionizing the neutral gas molecules can be improved and the plasma generation is stabilized.

Modulation of the microwaves is also performed by the same effect as that in the increase of the power. That is, when the microwave power is modulated, the supplied power is the same in comparison to the usual case that the microwave power is constant, but part of higher power and part of lower power exist in comparison to the usual case. In the part of higher power, the plasma generation can be stabilized by the same effect as that of increasing the microwave power as above described.

When the dimensions and the arrangement of the processing chamber for generating the plasma are set to the condition of cavity resonance, the supplied microwaves resonate within the processing chamber and the electric field intensity of the microwaves within the whole processing chamber can be strengthened. Thereby, since the electrons existing at the space within the whole processing chamber are accelerated and the ionization of the neutral gas is promoted, the plasma can be generated stably.

In the case of the E mode, the surface current flows radially from the center towards the periphery in the inner surface of the slot plate mounted on or in the cavity resonator. Consequently, the surface current density becomes small in the position remote from the center. The length of the annular slots in plural structure provided on the slot plate in the direction crossing the surface is set to value in the vicinity of ½ of the wavelength λ of the microwaves so as to improve the antenna efficiency. Therefore the integrated value of the surface current per one slot also becomes small from the center towards the periphery. Since the electric field intensity of the microwaves radiated from the slot is nearly proportional to the density of the surface current crossing the slot, the electric field intensity of the microwaves radiated from the slot at the center of the slot plate among the annular slots in plural structure is higher than that in the case of the periphery and the plasma generation becomes easy.

Also in the E mode, when a slot locking arrangement capable of opening and closing only the slot at the center of the slot plate among the annular slots in plural structure is installed and the plasma is generated in the processing chamber, if the microwaved are introduced in the cavity resonator in the state of opening the slot at the center, since the microwaves with high electric field intensity are radiated from the slot at the center, the plasma can be generated easily. On the other hand, after the plasma generation, the slot locking arrangement is operated and the slot at the center is locked or closed, whereby microwaves are radiated from only the slot at the periphery. In this case, the electric field intensity of the radiated microwaves is small in comparison to the case at the center, but is sufficient to maintain the generated plasma. Thereby, at the position of generating the plasma, the plasma density on the wafer becomes uniform in comparison to the case that the microwaves are radiated also from the slot at the center. As a result, the uniformity of the wafer processing is improved and the plasma can be generated easily.

Also when the slot at the center has a small width in comparison to the slot at the outer circumference and the opening area of the slot is made small, the slot at the center is in the region having the high density of the surface current, whereby microwaves of high power density and strong electric field intensity are radiated in the processing chamber. Therefore, even if the impressed microwave power is not increased, the plasma can be easily ignited by low power. Also since the slot at the center has a small opening area, the microwave power radiated from the slot occupies a small ratio to the whole microwave power radiated from the cavity resonator into the processing chamber, and the radiated microwaves can improve the uniformity of the power distribution.

The above and other objects, features and advantages of the present invention will become more apparent from the following description when taken in connection with the accompanying drawings which show, for the purposes of illustration only, several embodiments in accordance with the present invention.

DETAILED DESCRIPTION OF THE PREFERRED EMBODIMENTS

Figure 1:
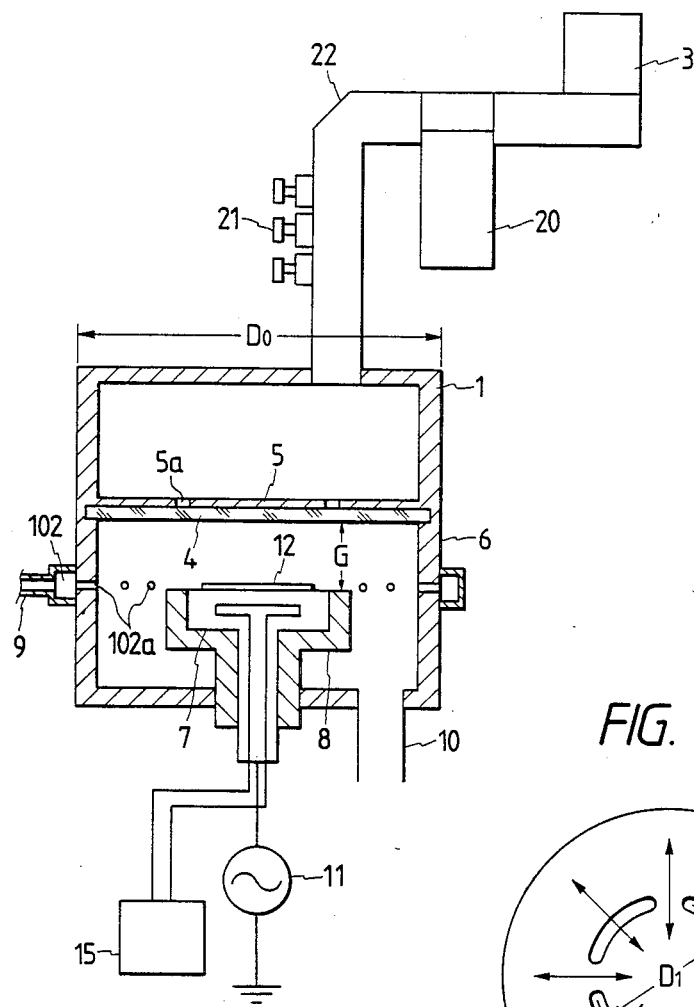
FIG. 1 is a sectional view of an embodiment of a plasma processing apparatus in accordance with the present invention.
Figure 2:
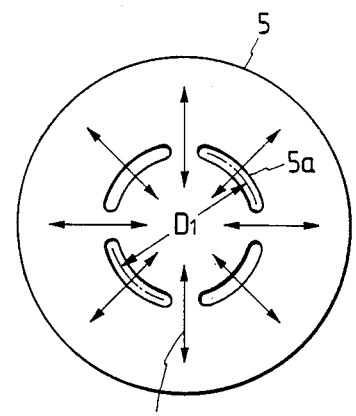
FIG. 2 is a plan view of a slot plate used in the plasma processing apparatus shown in FIG. 1.

Referring now to the drawings, there is shown in FIG. 1 a plasma processing apparatus including a cavity resonator 1 in the form of a circular cavity resonator of $E_{01}$ mode, wherein microwaves of 2.45 GHz are supplied from a magnetron (microwave oscillator) 3 through an isolator 20 and a stub tuner 21 installed on a waveguide 22. In order to improve the coupling with the $E_{01}$ mode, mounting of the stub tuner 21 is performed in an eccentric state to the circular cavity resonator 1 so that the direction of the electromagnetic field is matched in the resonator and the stub tuner 21. The size or diameter of the circular cavity resonator 1 is $\phi 100-\phi 400$ min, and a slot plate 5 is fixed to other side. The slot plate 5 is provided with slots 5a as shown in FIG. 2, wherein the numbers of slots 5a is 2-10 in a single to triple structure, each slot having a length 65-25 mm and a width 5-20 mm, are arranged at regular intervals on the circumference of $\phi 60-350$ mm, and the opening area is 5-130 cm$^2$. Each slot 5a has a length of 65-25 mm, but if the inside slot plate and the outside slot plate can be held by separate members, it is apparent that all slots 5a may be connected in single structure.

From the viewpoint of uniformity of the plasma, the slots 5a may be arranged in single structure substantially on the external shape position of a substrate 12 as shown in FIG. 1 or on position slightly to the outside thereof. However, when etching is performed to an oxide film such as SiO$_2$, thereby drawing many ions into the substrate 12, or when the gap G between the substrate 12 and a separation plate 4 formed of quartz or the like is made about 30 mm, and if the slots 5a in a single structure having a diameter about 180 mm are formed, since the plasma is not supplied to the center portion (inside) of the substrate 12 so that the etching property becomes bad, in order to compensate therefor, an the inside slot having a diameter of about 60 mm must be provided at the center portion. Also in the case of a plasma processing gas not being able to be ignited, an inside slot of about 60 mm may be provided at the center position (inside) where the surface current density becomes high. However, it must be considered that the are is made as small as possible and the uniformity of the plasma processing is not deteriorated significantly.

As shown in FIG. 1, a processing chamber 6 exists under the cavity resonator 1 and is separated by the separation plate (quartz plate) 4, and has a sealed structure in vacuum. The processing chamber 6 is provided with a stage 7 holding a substrate (wafer) 12, a gas supply pipe 9 and an exhaust pipe 10. A plasma processing gas is supplied to the gas supply pipe 9 from a gas source (not shown) by set flow rate and is blown off into the plasma processing chamber 6 through a gas blow-off port 102a of a gas supply chamber 102 installed at the inside of the plasma processing chamber 6. The exhaust pipe 1 0 is connected to a vacuum exhaust pump (not shown) so that pressure of the processing chamber 6 can be controlled to pressure of $100-10^{-2}$ Pa. The stage 7 is insulated from the processing chamber 6 by an insulation material 8, and a high-frequency bias voltage can be applied thereto from a bias power source 11. However, in order to form a CVD film to the substrate 12, it is not necessary that the bias power source 11 is installed and the bias voltage is applied to the stage 7. When the plasma processing apparatus is used for etching or the like, the stage 7 is supplied with a refrigerant from a chiller unit 15, and the stage 7 is cooled so that temperature of the substrate (wafer) 12 during processing such as etching does not rise.

Since the cavity resonator 1 has no magnetic field, the microwave radiated through the slot 5a into the plasma processing chamber 6 is almost absorbed in the vicinity of the slot. This is because the microwave scarcely travels in the plasma with the plasma density being high ($10^{10}$–$10^{11}$ cm$^{-3}$). Consequently, the vicinity of the slot 5a becomes the generating source of the plasma. Since there is no magnetic field, diffusion of the plasma becomes double polarity diffusion. The plasma density distribution of the plasma processing chamber may be considered to be a mechanism wherein the plasma generating source exists in the vicinity of the slot s that the plasma spreads in the double polarity diffusion and disappears on the inner wall surface of the plasma processing chamber 6 and the surface of the substrate (wafer) 12.

Figure 3:
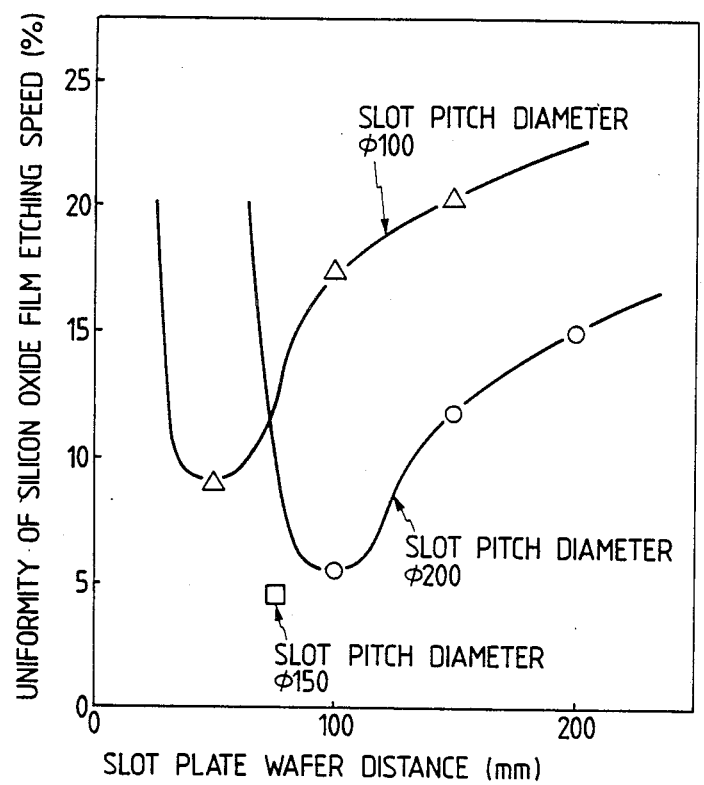
FIG. 3 is a diagram illustrating a relation between etching characteristics of a silicon oxide film and a slot plate in an embodiment of the invention.
Figure 4:
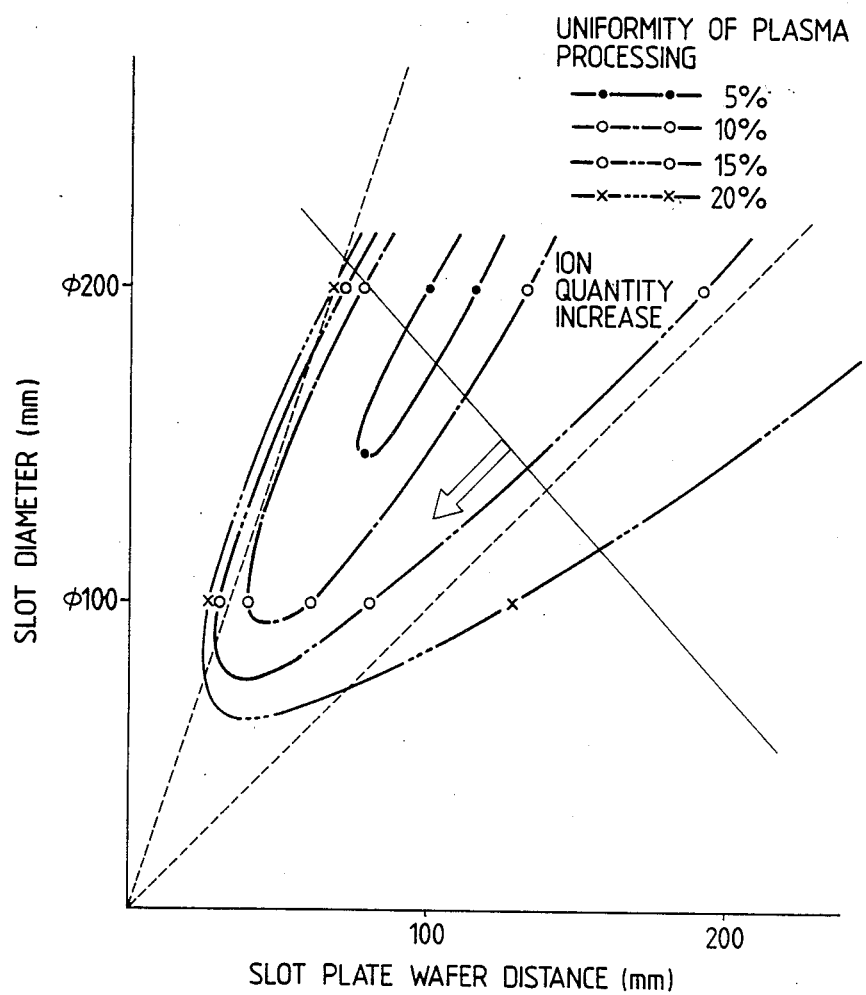
FIG. 4 is a diagram illustrating etching characteristics (plasma density distribution) of a silicon oxide film from a relation between a distance between a separation plate and a substrate and diameter of a slot of a slot plate in FIG. 3.

On the other hand, in the etching of the silicon oxide film which best represented the uniformity of the plasma density throughout the whole surface of the substrate, the uniformity of the etching of the silicon oxide film to the distance G between the substrate 12 and the separation plate 4 with a slot diameter of 100 mm, 150 mm, 200 mm is estimated by experiment as shown in FIG. 3. In this case, size of the substrate 12 is $\phi$150 mm. When the size of the substrate 12 becomes large such as $\phi$180 mm, $\phi$200 mm, both the distance G between the substrate 12 and the separation plate 4 and the slot diameter seem to be shifted. That is, the experimental result of FIG. 3 is represented by the uniformity of the etching of the silicon oxide film in relation of the distance G between the substrate 12 and the separation plate 4 and the slot diameter as shown in FIG. 4. This relation is comparatively coincident with the relation determined from the above-mentioned theory.

As a result, if the diameter $D_1$ of the slot 5a is made about 1-3 times the distance G between the substrate 12 and the separation plate 4, a uniformity $\pm 15\%$ of the plasma density can be well obtained. If the diameter $D_1$ of the slot 5a is less than this value, the plasma density at an intermediate position between slots becomes high due to the double polarity diffusion from both slots, and if the diameter $D_1$ is widened from this value, the plasma density at the intermediate position between both slots become low. Since the dimension $D_1$ of the plasma processing chamber 6 or the cavity resonator 1 must be usually formed larger than the slot diameter $D_1$, it must be also made about 1-3 times or more the distance G between the substrate 12 and the separation plate 4.

Figure 5:
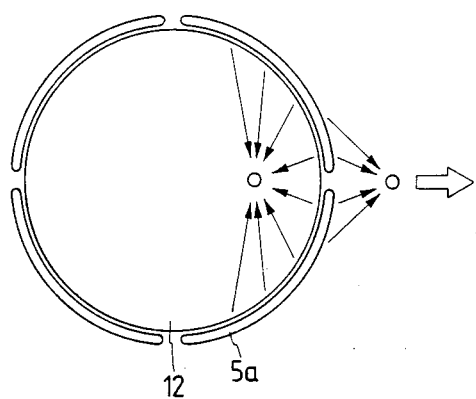
FIG. 5 is a plan view illustrating a state of ions incident from plasma generated in the vicinity of a slot at the outside position and the inside position of the slot with respect to the surface position of the substrate.

On the other hand, as shown in FIG. 5, since the plasma attains to the surface of the substrate 12 due to the double polarity diffusion, the plasma density on the surface of the substrate 12 becomes the sum of the plasma diffusion in the double polarity diffusion from each part of the slot. Since the slot is of circular shape, as the position of the slot comes to the outside as shown in arrow, influence of the diffusion from the nearest slot becomes large and influence of other parts becomes small, thereby the plasma density is rapidly decreased at the outside from the position of the slot. Consequently, the outside slot 5a is disposed to the outside from the outer circumference of the substrate 12, whereby the uniform plasma processing can be performed throughout the whole surface of the substrate 12. That is, when the distance G between the substrate 12 and the separation plate 4 is narrowed to 100 mm or less and the ion quantity introduced to the substrate 12 is increased, since the plasma density is decreased at the center portion of the substrate 12, the inside slot having, for example, diameter of about 60 mm is provided corresponding to the center portion of the substrate 12, whereby the uniformity of $\pm 15\%$ can be secured throughout the whole surface of the substrate.

On the other hand, in the case of the cavity resonator of the present invention, it is inevitable for generation and maintaining of the plasma that the electric field intensity of the microwaves are strengthened and electrons are accelerated efficiently and the number of electrons is increased. The electric field intensity of the microwaves depends on the microwave power supplied to the cavity resonator 1 and the opening area of the slot 5a through which the microwaves are radiated. If the microwave power becomes large, the electric field intensity is strengthened, and if the opening area becomes small, the electric field intensity is strengthened. That is, the electric field intensity of the microwaves are determined by the microwave power per opening area to which the microwaves are supplied. It has been found by the experiment that the plasma can be maintained by impressing a microwave power of 1 W/cm$^2$ or more.

If the microwave power is increased and the power density per the opening area is increased, the reflected wave increases and the discharge becomes unstable. This is because the plasma density in the vicinity of the slot 5a becomes high and the microwaves are reflected by the plasma and cannot be absorbed by the plasma efficiently. Consequently, in such case, the width dimension or the like of the slot 5a may be widened and the microwave power per the opening area may be decreased. The power density which can maintain the discharge stably in such manner is usually about 30-50 W/cm$^2$, although being dependent on the type of the plasma processing gas. However, only when the microwave power density per the opening area is made proper, the plasma cannot be generated stably. For example, if the opening area is made small, since the impedance to radiate the microwave to the space becomes large, the microwaves supplied from the microwave oscillator (magnetron) 3 to the cavity resonator 1 are reflected and the supply becomes difficult. Consequently, it is necessary that impedance radiating from the slot 5a be made as small as possible. However, the impedance becomes large not only when the opening area is made small. Radiation of the microwave are different also depending on which direction the opening is provided for the surface current flowing through the inside of the waveguide 22 or the cavity resonator 1 which may be considered as a type of waveguide 22.

As shown in FIG. 2, if the opening is provided in a slot shape (having the longitudinal direction) in the orthogonal direction to the surface current, since the current is cut by the slot 5a, the charge is stored on both ends of the slot 5a and varied in the frequency of the microwaves, whereby the microwave is radiated from the opening portion (slot) 5a efficiently. On the contrary, if the opening having the longitudinal direction of slot shape is provided in the same direction as the current, since there is little charge stored on the parts surrounding the slot, microwaves are scarcely radiated even if the opening area is large. Consequently, the reflection becomes large also in such condition.

Figure 6:
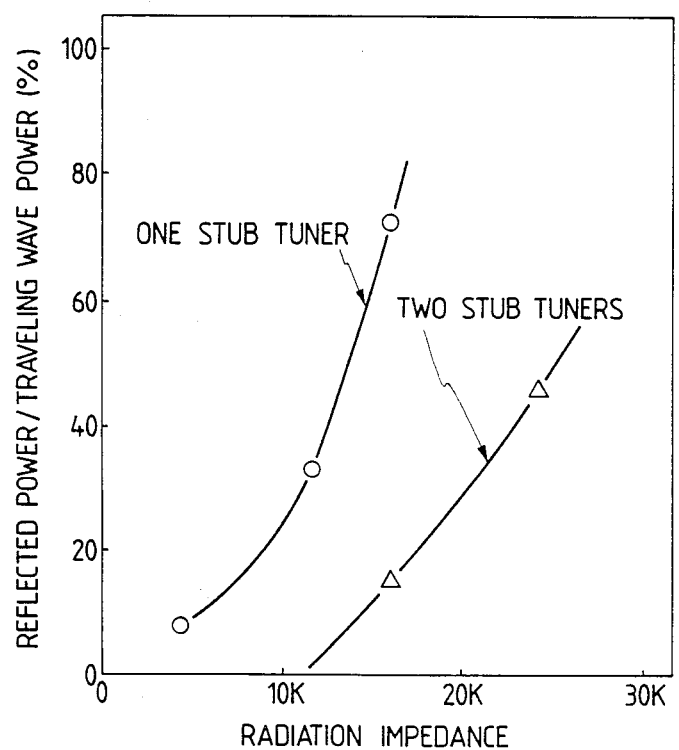
FIG. 6 is a diagram illustrating radiation characteristics of microwaves in an embodiment of the invention.

Radiation performance of the microwave including the opening shape of the slot, direction of the opening or the like is represented by impedance of radiation of the microwaves. That is, in order to generate the plasma stably, the microwave with the proper power density are supplied to the plasma processing chamber 6 and the impedance of radiation must be proper. When the stub tuner 21 with a voltage standing wave ratio up to 10 as is conventionally being utilized, as shown in FIG. 6, if the radiation impedance exceeds 10 kο, ratio of the reflected power is rapidly increased and supply of the power to the plasma becomes difficult such that maintaining of stable radiation also becomes difficult.

Figure 7:
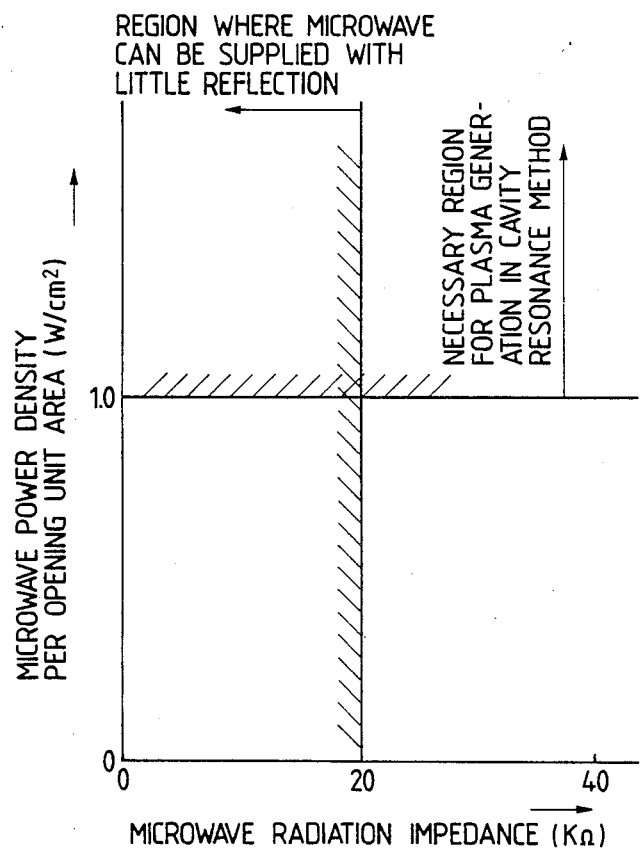
FIG. 7 is a diagram illustrating a relation between microwave radiation characteristics and microwave power density in an embodiment of the invention.

In order that the voltage standing wave ratio is further increased and the plasma is generated stably under a condition of high radiation impedance, a measurement was performed connecting the two stub tuners 21. In this case the plasma can be generated with small reflection up to a region with the radiation impedance being as high as 20 kο in comparison to the case of one stub tuner. However, since the adjusting bars of the stub tuners 21 become six in number and the adjustment becomes very difficult and the Q value within the cavity resonator 1 becomes high, the surface current is increased and the microwave power is consumed and this is accompanied by a problem that the temperature of the cavity resonator 1 itself becomes high. Consequently, the practical radiation impedance is 20 kο or less. The range for practical use, although depending on the performance of the stub tuners, is a range wherein the radiation impedance is 20 k$\Omega$ or less as shown in FIG. 7. In this range, the reflection is small and stable use is possible.

The radiation impedance is calculated by measuring the voltage standing wave ratio in the tuning point where the reflection becomes minimum. The voltage standing wave ratio $\rho$, is expressed in formula (3) by reflection coefficient $\Gamma$. The reflection coefficient is expressed in formula (4) by the input impedance $Z$. and load impedance $Z$ as shown below.

$$\rho = (1+|\Gamma|)/(1-|\Gamma|) \quad (3)$$

$$= (Z-Z.)/(Z+Z.) \quad (4)$$

The voltage standing wave ratio is measured and the load impedance $Z$ can be calculated.

Next, the operation of the embodiment of FIG. 1 will be described. The plasma processing gas is supplied, and on the other hand it is drawn off from the exhaust pipe 10 so that pressure within the plasma processing chamber 6 is held constant to a pressure of about 1 Pa. Microwave of 2.45 GHz are oscillated from the microwave oscillator (magnetron) 3 and the stub tuner 21 is adjusted. The oscillated microwaves are supplied to the cavity resonator 1 efficiently and radiated from the slot 5a. An isolator 20 is installed so that the magnetron is not rendered inoperable by microwave reflected microwaves when the adjustment is insufficient. The supplied microwaves are scarcely reflected, but rather are supplied to the cavity resonator by adjusting the stub tuner 21 so as to resonate within the cavity resonator 1 and be radiated from the slot 5a. In the embodiment, since the opening area is 5.-130 cm and the microwave power density utilized is in a range of 1–50 W/cm$^2$, stable processing can be performed in the range of the microwave power 2.5 W–5 kW.

The etching characteristics of a silicon oxide film according to the embodiment will now be described. FIG. 3 shows that for a slot diameter of 100 mm, the uniformity is best when the distance G between the separation plate 4 which is disposed adjacent the slot plate 5 and the substrate 12 is 50 mm. In the case of the slot diameter being 200 mm, the distance G of 100 mm is the optimum. In the etching of the silicon oxide film, ions incident from the plasma are the rate-determining factor of the etching. Consequently, the uniformity of the etching rate of the silicon oxide film represents the uniformity of the plasma density distribution. Thus it has been confirmed by the experiment that the uniformity of the plasma is good when the slot diameter D, is about twice of the distance between the separation plate and the substrate.

In the etching of the silicon oxide film, since ions are the rate-determining factor of the etching, an increase of the ion quantity incident to the substrate (wafer) 12 is necessary for high-speed processing, the plasma density on the substrate 12 is decreased when the distance G between the separation plate 4 (the slot plate 5) and the substrate 12. Consequently, in the etching of the film, since a decrease of the distance G between the separation plate 4 (the slot plate 5) and the substrate 12 is necessary, the distance G was set to 30 mm. In this case, when only the outside slot is used, since the etching amount at the center portion of the substrate becomes small in comparison to the outer circumferential portion the uniformity is deteriorated, and it is necessary that an inside slot be provided so that the slots are made double or triple structure. When a slot 5a of single structure is provided in the inside, an inside slot diameter of about 60 mm becomes the optimum value when the diameter of the substrate is 150 mm. In this case, the microwave radiation performance per unit opening area is different between the inside slot 5a and the outside slot 5a.

Figure 8:
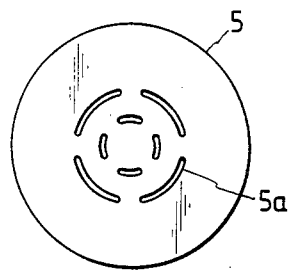
FIG. 8 is a plan view of a slot plate used in etching of a silicon oxide film.
Figure 9:
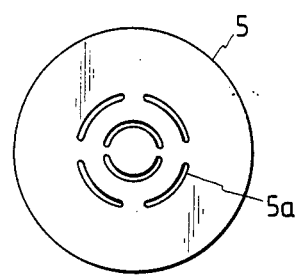
FIG. 9 is a plan view of another slot plate which is an improvement of the slot plate shown in FIG. 8.
Figure 10:
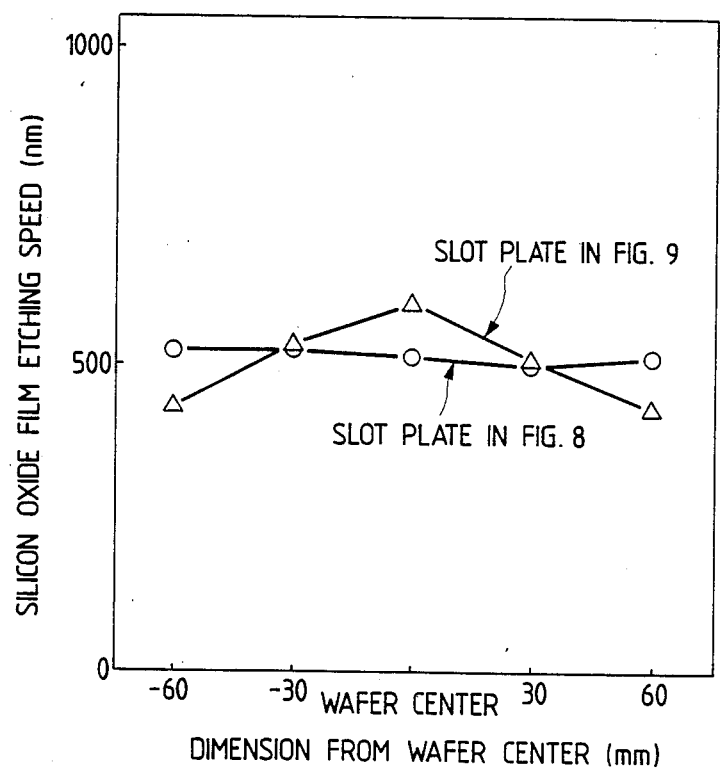
FIG. 10 is a diagram illustrating uniformity of etching speed of a silicon oxide film.

Radiation of microwaves from the slot 5a is performed as shown in FIG. 2 in that the slots 5a extends in the orthogonal direction to the surface current, and the charge of the surface current is stored on both ends of the slots 5a and varied in the frequency of the microwaves whereby an electric field generated between both ends of the slot is varied and the microwaves are varied. Consequently, the radiated microwave power is proportional to the surface current density. This causes no problem in the case that the current density in the position of providing the slots 5a is equal as shown in FIG. 2, but indicates that values of microwave power radiated in the inside slot and the outside slot are different when the slots becomes a double structure and the inside slot 5a and the outside slot 5a are different in surface current density as is the case of the double slot arrangement shown in FIGS. 8 and 9, for example. Consequently, in the slot constitution of a double or triple structure, it is necessary for uniformization of the plasma density corresponding to the surface current density depending on the slot position, length of the slot, thickness of the slot plate, width of the slot and the like which are varied so that the microwave power radiated from each slot is made equal. When the diameter of the slot 5a is only set to about 60 mm, about 180 mm in the condition that influence of the diffusion of the plasma becomes uniform, this setting is insufficient. As shown in FIG. 8, the length of the inside slot 5a is made as short as about 25 mm or the width is narrowed whereby the etching amount at the center portion of the substrate 12 is decreased and radiation performance of the microwave is lowered in order to realize the uniformity of the microwave radiation power density. Thus, with a combination of the outside slot and the inside slot, the uniformity of the etching can be improved as shown in FIG. 10. Although FIGS. 8 and 9 represent variation of the length of the slot, in order to vary the radiation performance, the width of the slot, the thickness of the slot plate or the like may be varied.

In the case of etching, an etching gas is supplied from the gas supply pipe 9. The etching gas is, for example, a mixed gas of $BCl_3$ and $Cl_2$ in the case of forming an aluminum wiring film, or gas such as $SF_6$ in the case of pattern formed of polysilicon. The etching gas is supplied, and on the other hand, it is blown off from the exhaust pipe 10 so that pressure within the processing chamber 6 is held constant to pressure of about 1 Pa. Microwaves of 2.45 GHz are oscillated from the magnetron 3. Next, the stub tuner 21 is adjusted, and the oscillated microwaves are supplied to the cavity resonator 1 and radiated from the slots 5a. By the plasma generated in this manner, the etching gas ($BCl_3+Cl_2$) is ionized and excited. Ions are accelerated by the high-frequency bias voltage applied to the stage 7 and are incident to the substrate 12. By these ions and the excited radical, the etching of the Al film progresses.

The etching of Poly-Si will be described. The mixed gas of $SF_6$ and fluorine, as an etching gas, for example, is supplied in total flow rate 50 ml/min into the processing chamber 6, and pressure of the processing chamber 6 is adjusted to 1.3 Pa. The microwave power is made 600 W in the substantial impressed power by subtracting the reflected power from the traveling power. Temperature of the stage 7 is controlled to 20° C., and the periphery of the substrate (wafer) 12 is clamped and the $SF_6$ gas flows to the rear surface of the substrate, whereby the cooling efficiency of the substrate is improved. The high-frequency bias applied to the stage 7 has a frequency being 13.56 MHz, and is set in a peak-to-peak value, i.e., Vpp. The distance between the separation plate 4 and the stage 7 is made about 150 mm. On the other hand, if the high-frequency bias voltage is increased to 0–150 V the poly-Si etching speed rises slightly, but the side etching amount, the selection ratio to $SiO_2$ and the uniformity are decreased. Particularly, the side etching amount is significantly decreased by applying only 50 V, and etching of high accuracy having hardly any side etching is realized. Although not shown, the deterioration rate of the lifetime, which is the criterion of damage, varies nearly in proportion to the high-frequency bias voltage, but the deterioration rate in 200 V is less than 10% and small damage is realized. Also the uniformity has a quite small variation value of less than ±3%. The selection ratio to $SiO_2$ is the etching speed ratio to $SiO_2$ of the ground film of Poly-Si and is preferably large. However, if the selection ratio is large, the etching amount increases and the accuracy is lowered. Considering these conditions, the high-frequency bias voltage preferable for etching with high accuracy, high selection ratio and low damage is in the range of 25–150 V. Also if the $SiO_2$ flow rate is increased nearly in proportion to the increase of the $SiO_2$ flow rate, the selection ratio to $SiO_2$ is varied in similar manner. The uniformity is about ±3% and is not varied much. The side etching amount is rapidly increased when the $SF_6$ flow rate exceeds 30%, and the accuracy is lowered. In this case, the flow rate of about 30% is the proper value. However, since these characteristics are significantly dependent on the type of gas in use, flow rate and pressure, the microwave power and the like, it is necessary to estimate the proper values individually for these conditions.

In the case of etching, in some type of gas, when the gas stays for a long time in the plasma, the gas is decomposed and bad influences may be produced. Consequently, as shown in FIG. 1, the gas may be blown off uniformly through gas blow-off ports 102a provided at regular intervals to the side wall (the outside of the substrate) of the plasma processing chamber 6 at a lower side of the generation of the plasma. When the embodiment of FIG. 1 of the invention is applied to the manufacturing of semiconductor elements, fine patterns which are excellent in the uniformity can be etched stably, whereby semiconductor elements with high reliability can be produced with good yield.

Figure 11:
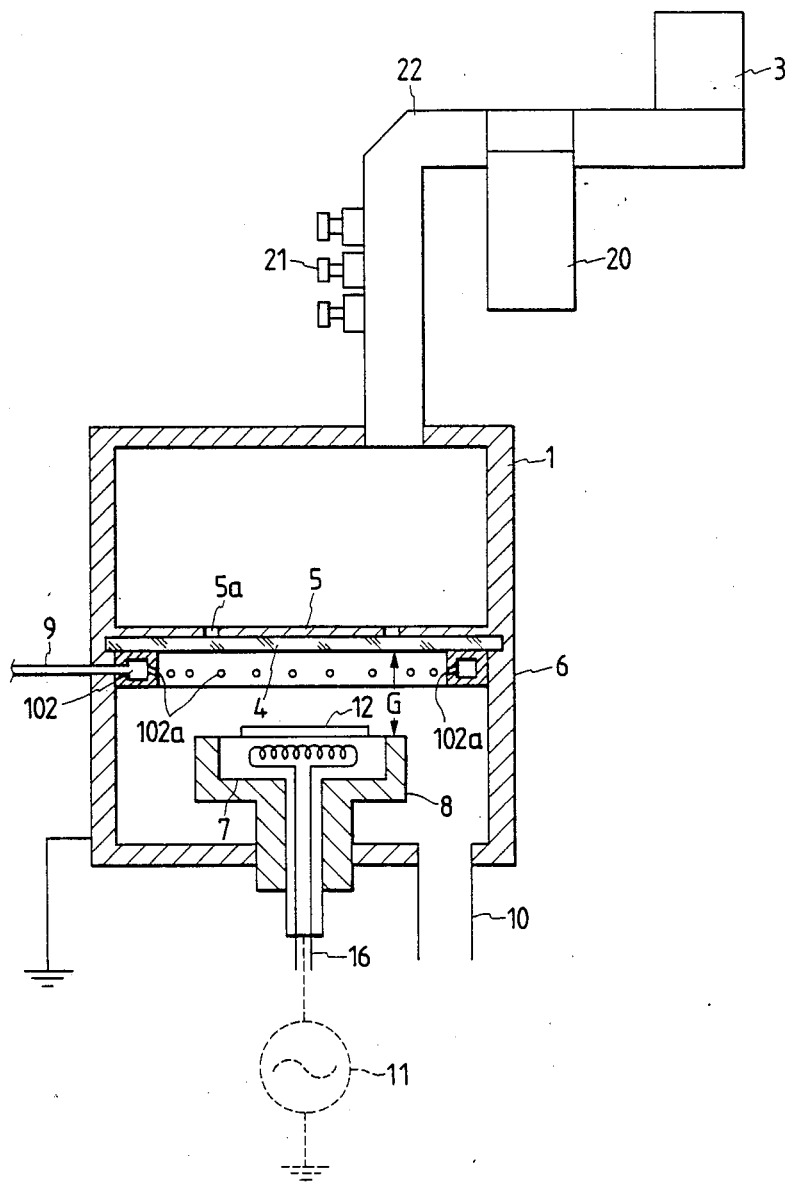
FIG. 11 is a sectional view illustrating another embodiment of the apparatus when the plasma processing apparatus of the invention is applied to CVD.

The invention as applied to formation of a silicon oxide film by a plasma CVD will now be described in connection with the embodiment shown in FIG. 11 and which is similar to the case of etching. FIG. 11 is different in that a heater 16 is assembled to the stage 7 and the substrate 12 can be heated to temperature of 400° C., and that if the gas for CVD is blown off through a number of blow-off ports 102a provided uniformly at nearly regular intervals from surrounding of the outside (side wall of a plasma processing chamber 6) close to the separation plate 4, the gas for CVD is introduced into the plasma uniformly, whereby a CVD film with good uniformity can be formed on the surface of the substrate. $SiH_4$ gas and $N_2O$ or $O_2$ gas and $N_2$ gas as a dilution gas are combined, and the combined gas is supplied from a gas supply pipe 9 and is blown off through the gas blowoff ports 102a of a gas supply chamber 102 into the plasma processing chamber 6. While exhausting is performed from an exhaust pipe 10, the pressure within the plasma processing chamber 6 is controlled to pressure of 100–10 Pa. The substrate 12 is set to the stage 7, and its temperature rises to 300°–400° C. Microwaves of 2.45 GHz oscillated by the magnetron 3, and plasma is generated within the plasma processing chamber 6. The $SiH_4$ gas and the $N_2O$ gas are excited and decomposed by the plasma, whereby an $SiO_2$ film is formed on the surface of the substrate. In the embodiment, a film can be formed without applying the high-frequency bias voltage, but if the high-frequency bias voltage is applied as shown in FIG. 1, the energy of the ions incident to the substrate can be controlled and stress of the formed film can be controlled.

The film forming speed becomes rapid by strengthening the microwave power, but if the microwave power becomes nearly 1 KW, the film forming speed scarcely increases. Further if the microwave power exceeds 1 KW, reflection of the microwaves increases and the discharge becomes unstable. Then the microwave power density becomes about 40–50 W/cm$^2$. On the other hand, the film forming speed depends on the flow rate of the SiH$_4$ gas, the microwave power, the pressure, and the distance between the separation plate 4 and the stage 7. Since the plasma of high density can be formed between the separation plate 4 and the stage 7, the SiH$_4$ gas supplied from the outer circumferential direction at the upper side is almost decomposed, and contributes to the film formation. Consequently, the film forming speed is varied in proportion to the flow rate of the SiH$_4$ gas. As the microwave power is strengthened, the film forming speed is increased, and if the microwave power becomes 1000 W, the film forming speed is apt to be decreased. Regarding the gas pressure, as the pressure is increased, the film forming speed is increased, but if the pressure exceeds 10 pa, the increase of the film forming speed is apt to be retarded. Regarding the distance between the separation plate 4 and the stage 7, as the distance is widened, the film forming speed becomes slow, and if the distance exceeds 100 mm, the rate of decrease is lowered. A factor significantly affecting the film quality is the ratio of flow rate of the SiH$_4$ gas and the N$_2$O gas. The microwave power, the gas pressure, the gas flow rate or the like have little influence on the film quality. In order to control the film quality, ratio of the flow rate of N$_2$O and SiH$_4$ is preferably made about between 1 and 3. According to the above-mentioned factors, a film with excellent uniformity can be formed uniformly, and semiconductor elements with high reliability can be produced with a good yield. The embodiment can be applied not only to etching but also to other processing using the plasma, such as plasma CVD, ashing and the like, by changing the processing gas.

Another embodiment of the invention will be described referring to FIG. 12 wherein the cavity resonator 1 is a circular cavity resonator of E$o_1$ mode, and microwaves of 2.45 GHz are supplied from the magnetron 3 through the isolator 20 and the stub tuner 21 mounted on a waveguide 22. In order to improve the coupling with the E$o_1$ mode, the mounting of the stub tuner 21 is performed in an eccentric state with respect to the circular cavity resonator 1 so that the direction of the electromagnetic field is matched in the resonator and the stub tuner 21. The size or diameter of the circular cavity resonator 1 is $\phi$250 mm, and the slot plate 5 is fixed to the side opposite the waveguide. The slot plate 5 is provided with slots 5a as shown in FIG. 2, and slots of four pieces, each having length 65 mm and width 10 mm, are arranged on the circumference of $\phi$150 mm. A processing chamber 6 exists under the cavity resonator 1 and is separated by a quartz plate 4, and has a sealed structure in a vacuum. The processing chamber 6 is provided with a stage 7 holding a wafer 12, a gas supply pipe 9 and an exhaust pipe 10. A plasma processing gas is supplied to the gas supply pipe 9 from a gas source (not shown) by a set flow rate. The exhaust pipe 10 is connected to a vacuum exhaust pump (not shown) so that pressure of the processing chamber 6 can be controlled to pressure of 100–10 Pa.

Figure 12:
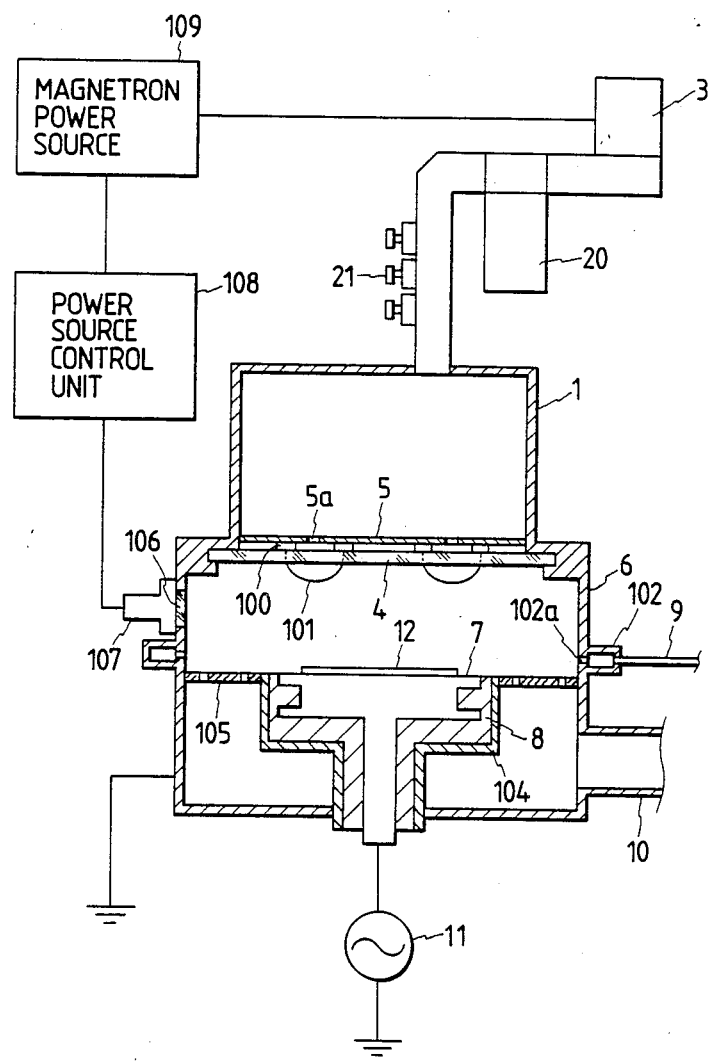
FIG. 12 is a sectional view of a plasma processing apparatus of a further embodiment of the invention where the plasma generation is stabilized.

As shown in FIG. 12, a thin magnet 100 is installed between the slot plate 5 and the quartz plate 4 and on a concentric circle with the slots 5a so that a magnetic field 101 is formed. A gas supply chamber 10 is installed at the outside of the processing chamber 6 so that the plasma processing gas supplied from the gas supply pipe 9 is blown off through a gas blow-off port 102a into the processing chamber 6 uniformly. A bias power source 11 is connected to the stage 7, and is covered through insulation material 8 by an earth or ground shield 104. A choke flange structure is formed between the stage 7 and the earth shield 104. A shield plate 105 is installed at the same height of the stage 7. The shield plate 105 is provided with an opening having size and shape sufficient to prevent the passage of microwaves while permitting the plasma processing gas to be exhausted. The space constituted by the processing chamber 6, the slot plate 5, the shield plate 105 and the stage 7 is set to dimensions so as to form a cavity resonator. The space has an E$o_1$ mode similar to the cavity resonator 1 installed on the upper side, whereby coupling is improved.

A lighting window 106 is provided on the side surface of the processing chamber 6, and a detector 107 of plasma light emission constituted by a photo transistor is mounted thereon. The detector 107 is connected to a power source control unit 108, and if plasma is generated within the processing chamber 6, the generation of the plasma can be detected by the power source control unit 108. A magnetron power source 109 operates the magnetron 3 at a definite set output and at a modulated output. The power source unit 108 is connected to the magnetron power source 109 so that the output of the magnetron power source 109 can be controlled.

The operation of the embodiment of FIG. 12 will now be described. In the case of etching, etching gas is supplied from the gas supply pipe 9. The etching gas is, for example, a mixed gas of BCl$_3$ and Cl$_2$ in the case of forming an aluminum wiring film, or a gas such as SF$_6$ in the case of a pattern formed of polysilicon The etching gas is supplied, and on the other hand, it is blown off from the chamber 6 so that the chamber is held at a constant to pressure of about 1 Pa. The magnetron power source 109 is operated, and microwaves of 2.45 GHz are oscillated from the magnetron 3. Next, the stub tuner 21 is adjusted, and the oscillated microwave are supplied to the cavity resonator 1 efficiently and radiated from the slots 5a. The isolator 20 is installed so that the magnetron is not rendered inoperative by the microwaves reflected when the adjustment is insufficient. The microwaves resonate within the cavity resonator 1, and are radiated through the slots 5a in the state of a strong electric field intensity so that the plasma can be generated stably.

When the microwave power is about 250 W, the plasma can be generated by only radiation from the slots 5a. However, in the case of a gas such as SF$_6$, if the microwave power is lowered, the generation of the plasma becomes difficult However, in the embodiment of FIG. 12, since the magnet 100 is installed a magnetic field 101 is formed. Electrons existing at the space in the vicinity of the slots 5a are accelerated by the microwaves radiated from the slots 5a. If the magnetic field 101 does not exist, the accelerated electrons are immediately diffused, but if the magnetic field 101 exists, the accelerated electrons are bound by the electric field and are always accelerated by the microwaves radiated from the slots 5a, whereby neutral gas molecules are ionized efficiently and the plasma can be generated even at lower microwave power (59–100 W).

Also in the embodiment of FIG. 12, control by the power source control unit 108 can be effected so that the supplied microwave power is increased and the generation of the plasma is stabilized only at the initial state of supplying the microwave, and then the microwave power is lowered after the plasma generation. In methods of strengthening the microwave power before the plasma generation, the region of strong electric field intensity is widened and many free electrons existing in the space are accelerated, whereby the probability of ionizing the neutral gas molecules can be improved and the plasma generation is stabilized. As a control method of changing the microwave power, a method of strengthening the microwave power by a definite time at the initial state and a method of detecting the generation of the plasma by the detector 107 and effecting change of the microwave power in accordance therewith may be utilized.

Further in such embodiment, the output voltage of the magnetron power source 109 is periodically varied, whereby the microwave oscillation output of the magnetron can be modulated. The method of modulating the microwaves is also performed by the same effect in the method of increasing the power. That is, when the microwave power is modulated, the supplied power is the same in comparison to the usual case that the microwave power is constant, but part of higher power and part of lower power exist in comparison to the usual case. That is, if the microwave output is modulated, even if the mean power is 100 W, maximum output at peak state can be made about 300 W, whereby the plasma can be generated stably. Control of whether the output of the magnetron is modulated or made constant can be performed by the power source control unit 108, and the microwave power may be controlled as previously described so that the modulated oscillation is performed before the plasma generation and constant oscillation is performed after the plasma generation.

In the embodiment of FIG. 12, the inside of the processing chamber 6 is set to the dimension of the cavity resonator, whereby the plasma can be generated even at low microwave power. The opposite surface of the slot plate 5 forms a cavity resonator together with the stage 7 and the shield plate 105. Also since a choke flange structure is formed between the stage 7 to which the bias voltage is applied and the earth shield 104, microwaves do not leak out although the structure is insulated. The microwave radiated from the slots 5a are strengthened by the above-mentioned cavity structure when the plasma is not generated so that the electric field intensity of the microwaves at the entire structure within the processing chamber 6 is strengthened. If a resonator structure is not provided, electrons are accelerated only in the vicinity of the slots 5a, but in the case of resonator structure, electrons are accelerated at the entire structure within the processing chamber 6, whereby the generation of the plasma becomes easy and the plasma can be generated stably even at the microwave power of about 50 W. It should be noted that all of the methods of stabilizing the plasma generation need not be performed at the same time, but may be selected and combined corresponding to characteristics of the plasma processing as an object.

The etching gas is excited and ionized by the plasma generated as above described. Since the etching gas is supplied through the blow-off ports 102a, gas flow is almost exhausted from an opening provided on the shield plate 105 and gas is supplied into the processing chamber by diffusion. Under the condition that the pressure during the processing is about 1 Pa, since the diffusion becomes large, the etching is supplied uniformly to the whole surface of the wafer by the diffusion. A high frequency of 13.56 MHz is applied to the stage 7 from the bias power source 11, and ions in the plasma are accelerated and incident to the wafer 12 The stage 7 is cooled by a cooling mechanism (not shown) so that softening of a resist due to temperature rise of the wafer to 100° C. or more is prevented. According to such arrangement, ions with energy properly controlled and excited radicals are uniformly supplied to the wafer 12, whereby the pattern with good accuracy can be etched uniformly.

It is apparent that the embodiment of FIG. 12 can be applied not only to etching, but also to plasma CVD and the like. In this case, the gas is changed to a film forming gas, and in some case, the stage must be heated to 300° C.–400° C. by a heating mechanism (not shown).

Next, processing characteristics in the case of applying the embodiment of FIG. 12 to etching of an Al wiring film will be described A mixed gas of BCl$_3$ gas and Cl$_2$ gas is used as an etching gas. In this system, the larger the distance G between the separation plate (quartz plate) 4 and the stage 7, the lower the plasma density on the stage surface. Consequently, if the distance G becomes wide, the ion quantity necessary for the anisotropic etching becomes small and side etching becomes great. If the distance is narrowed, the density distribution of the plasma becomes bad and uniform etching cannot be performed. The proper range of the distance G is 300 mm to 150 mm, but the processing can be performed in an area outside this range. In other processing such as ashing not requiring incident ions, no problem occurs even when the processing is performed in an area outside this range.

The diameter of the slots arranged in ring shape is $\phi$150 mm in the embodiment of FIG. 12, but this applies to the case where the distance between the quartz plate and the stage is 100 mm or more. When the distance is 70 mm to 100 mm, the dimension of $\phi$160–$\phi$180 mm is suitable. The pressure condition of about 1 Pa is suitable, and as the pressure becomes high, side etching is liable to occur. In a low pressure condition, in order to perform the exhausting of the etching gas of the same amount, the exhausting capacity must be increased in proportion to lowering of the pressure. Consequently, in an apparatus having large exhausting capacity, the etching is possible even at the pressure condition of 0.5 Pa–0.1 Pa which is substantially lower than 1 Pa.

Figure 13:
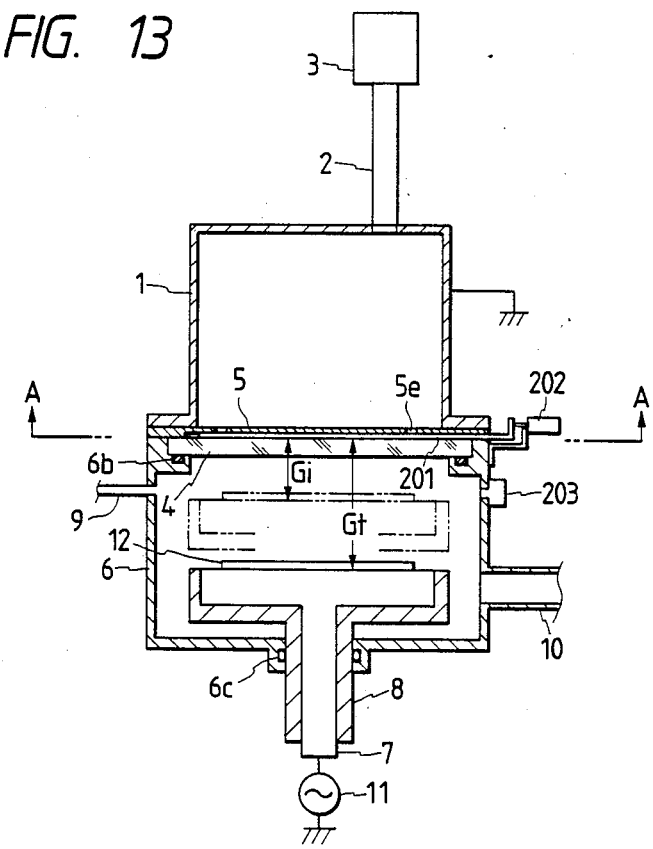
FIG. 13 is a sectional view of a plasma processing apparatus of another embodiment of the invention where the plasma generation is stabilized and the processing is uniformized.
Figure 14:
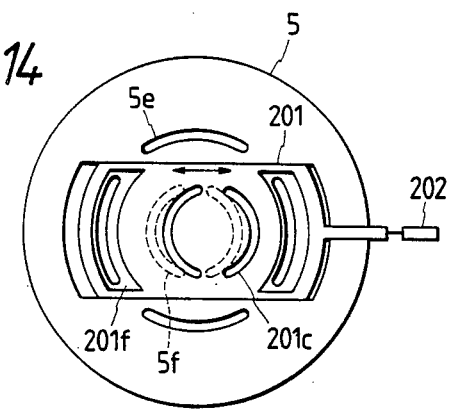
FIG. 14 is a plan view illustrating details of a part of the structure of the embodiment shown in FIG. 13.

A further embodiment of the invention will be described referring to FIGS. 13 and 14. A stage 7 holding a wafer 12 is surrounded by an insulator 8 and installed at lower side of a processing chamber 6 A quartz plate 4 is mounted through a seal 6b in air tightness on the upper side of the processing chamber 6. A cavity resonator 1 is installed on the upper side of the quartz plate 4, and a slot plate 5 is fixed to the lower end of the resonator 1. A slidable locking plate 201 is installed between the slot plate 5 and the quartz plate 4, and the end of the locking plate 201 is connected to a cylinder 202. Processing gas, for example, a mixed gas of SiH$_4$ and N$_2$O in plasma etching, or a single or mixed gas of halogen in the dry etching, is introduced through a gas supply pipe 9 into the processing chamber 6, and pressure within the processing chamber is controlled to a prescribed pressure by a pressure control system (not shown) connected to an exhaust hole. Microwaves of 2.45 GHz generated by a magnetron 3 is introduced through a waveguide 2 to the cavity resonator 1. A strong electromagnetic field is generated by resonance within the cavity resonator 1, and a strong surface current flows at the inner wall thereof. As a result, microwaves are radiated from slots 5f and 5e of the slot plate 5 into the processing chamber 6. In this case, since microwaves with strong electric field intensity are radiated from the slot 5f in the center region, the plasma can be generated easily If the plasma is generated, a signal is generated from a plasma detector 203 to a control system (not shown), and the cylinder 202 is operated based on the signal and the locking plate 201 is operated and slot 5 is locked or closed. And then microwaves are radiated only through the slots 5e, whereby the plasma density on the peripheral portion of the processing chamber 6 is raised and the plasma density at the center portion is lowered, thus the plasma density distribution being more uniform as a whole can be obtained. As a result, CVD or dry etching with high uniformity can be realized, and reliability and yield of products can be improved. According to the embodiment as above described, the plasma can be generated easily and the uniformity of the wafer processing can be improved.

In addition to the above-mentioned method, generation of the plasma can be made easy by following methods. In a first method, at least on the plasma generation, when the distance between the slot plate 5 and the stage 7, i.e., the electrode distance is made Gi, and the wavelength of the microwaves λ, the stage 7 is raised to the position of $$G_i \leq \frac{\lambda_o}{4} + \frac{\lambda_o}{8}$$

where Gi is the value after correction of the wavelength for the dielectric constant of the quartz plate 4. In this case, if the microwaves are radiated into the processing chamber 6, the standing wave of the microwaves is generated between the slot plate 5 and the stage 7 and effect preventing of attenuation of the electric field intensity of the radiated microwaves, whereby the plasma can be generated easily. After the plasma generation, the stage 7 may be moved up and down so that the electrode distance Gt becomes favorable for the wafer processing.

In a second method, the high-frequency power source 11 is operated before the generation of the plasma by radiation of the microwaves, and the high-frequency voltage is applied between the stage 7 and the slot plate 5 or the processing chamber 6 so that rare plasma is generated. In this state, if the microwaves are generated from the slot 5, electrons existing in the rare plasma are accelerated by the electric field of the microwaves and have higher energy, whereby ionization of the gas molecules is promoted. As a result, the plasma of high density can be generated Since the rare plasma by high frequency is generated before the radiation of the microwaves in this manner, a strong electric field of microwaves usually required for the plasma generation becomes unnecessary. Thereby, the slot 5f at the center region of the slot plate 5 also becomes unnecessary. Consequently, the plasma of high density can be maintained by only the slot 5e at the peripheral side, and the uniformity of the wafer processing can be also improved.

Figure 15:
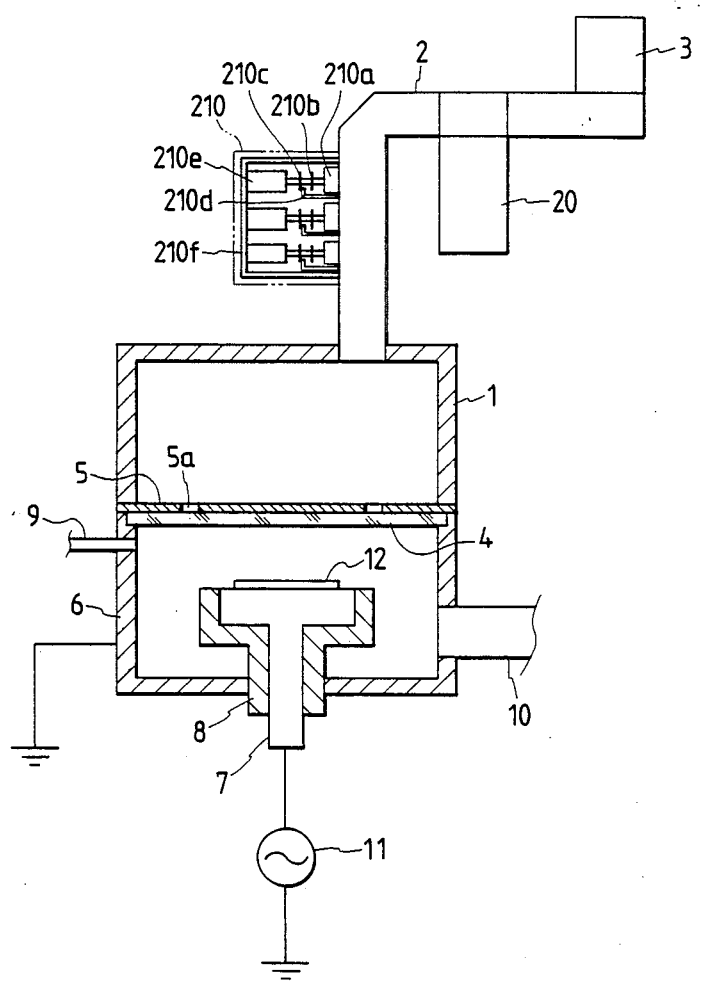
FIG. 15 is a sectional view of another embodiment of the invention where the plasma generation is stabilized.
Figure 16:
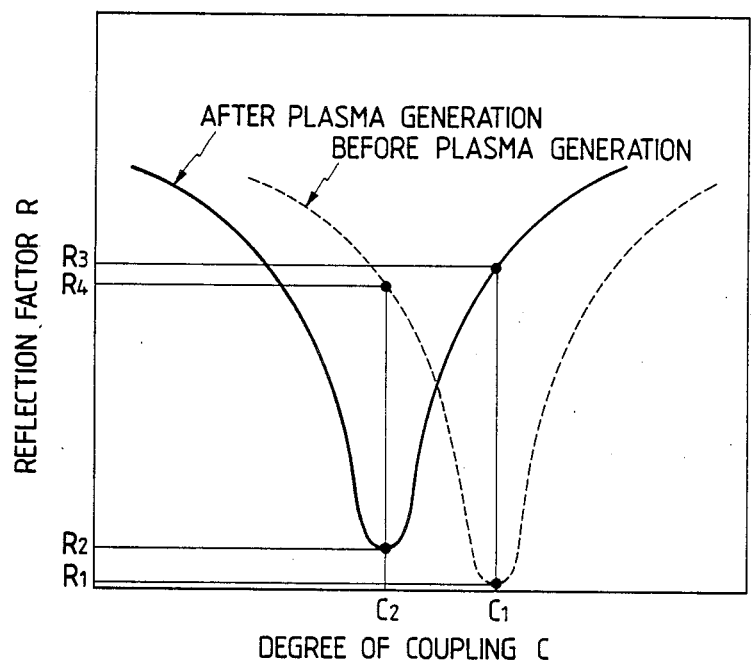
FIG. 16 is a diagram illustrating matching characteristics of a stub tuner shown in FIG. 15.

Another embodiment of the invention will be described referring to FIG. 15 which corresponds in structure and function to the embodiment of FIG. 1 so that only the different points will be described. In FIG. 15, numeral 210 designates an automatic stub tuner, comprising a tuner bar 210a, stoppers 210b, 210c, 210d fixed in a position variable state with respect to the tuner bar 210a, a cylinder 210e, and a fixing bracket 210f of the cylinder. Microwaves generated by the magnetron 3 are introduced through a waveguide 2 into a cavity resonator 1. The automatic stub tuner 210 operates the cylinder 210e, and draws the tuner bar 210a to the position where the stopper 210b abuts the stopper 210d. In this state, the plasma is not yet generated in the processing chamber 6. In this case, since matching characteristics of the microwaves are in the degree of coupling $C_1$ shown by broken line curve in FIG. 16, and the reflection factor also is as small as $R_1$ and the matching is sufficient, microwaves of a strong electric field can be radiated from the slot 5a, whereby plasma can be easily generated in the processing chamber 6. If the plasma is generated, since the degree of coupling is varied and transferred to matching characteristics shown by the solid line curve of FIG. 16, when the matching state remains in the condition of the degree of coupling $C_1$ before the plasma generation, the reflection factor is significantly increased from $R_1$ to $R_3$ and the reflection becomes excessive so that sufficient microwaves are not supplied to the cavity resonator 1 after the plasma generation Consequently, after the plasma generation, the cylinder 210a of the automatic stub tuner 210 is moved rapidly and changed to the position where the stopper 210c abuts the stopper 210d, thereby matching is performed so that the degree of coupling becomes $C_2$, and microwaves sufficient for plasma generation can be supplied. Thereby, plasma generation becomes easy, and the generated plasma can be maintained stably. Since the automatic stub tuner 210 does not require a complicated control system, it is formed at low cost and moreover has high reproducibility in structure and therefore can be operated for a long time with stable performance.

Although microwaves of a frequency 2.45 GHz have been described, it is apparent that similar states may be produced utilizing different frequencies Since plasma generation by the microwaves can be effected stably from a low microwave power to a high microwave power, the plasma can be processed over wide plasma processing condition. The processing can be performed under an optimum condition corresponding to an article to be processed as an object. Consequently, in the case of etching, a fine pattern can be formed with good accuracy. Also in the case of CVD, intended film quality, coverage or the like can be easily obtained. Since the supply of microwaves is made uniform, the uniformity of the plasma processing can be improved and semiconductor elements with fine pattern dimensions can be produced with good yield. Furthermore, a choke flange structure is formed between the stage and the earth shield so that leakage of the microwaves through the insulation material 8 can be prevented and safety can be also improved.

While we have shown and described several embodiments in accordance with the present invention, it is understood that the same is not limited thereto but is susceptible to numerous changes and modifications as known to one of ordinary skill in the art, and we therefor do not wish to be limited to the details shown and described herein but intend to cover all such modifications as are encompassed by the scope of the appended claims.

What is claimed is:

1. A plasma processing apparatus comprising:
   microwave generator means for generating microwaves;

waveguide means for supplying microwaves generated by the microwave generator means;

cavity resonator means for resonating the microwaves supplied by the waveguide means;

plasma processing chamber means, the plasma processing chamber means being coupled to the cavity resonator means for receiving resonated microwaves therefrom and for generating a plasma therein, the plasma processing chamber means having means for holding a substrate for plasma processing, means for introducing a plasma processing gas to the plasma processing chamber means, and means for exhausting gas therefrom;

separation plate means for separating the cavity resonator means and the plasma processing chamber means and for enabling resonated microwaves to be transmitted therethrough from the cavity resonator means to the plasma processing chamber means; and slot plate means disposed in the cavity resonator means in opposition to a surface of the substrate for enabling radiation of the resonated microwaves to the plasma processing chamber means through the separation plate means, the slot plate means including at least one set of circumferentially extending slots for enabling radiation of resonated microwaves having a power density of at least 1 W/cm$^2$.

2. A plasma processing apparatus according to claim 1, wherein the slot plate means enables a power density of 30-50 W/cm$^2$.

3. A plasma processing apparatus according to claim 1, wherein the at one least set of circumferentially extending slots delimit a cross-sectional area of the slots of 5-130 cm$^2$ for enabling impedance matching.

4. A plasma processing apparatus according to claim 1, wherein a diameter $D_1$ of a center line of the at least one set of circumferentially extending slots has a predetermined relation to a separation distance G between the separation plate means and the substrate.

5. A plasma processing apparatus according to claim 4, wherein the predetermined relation is $D_1 = (0.75-3)G$.

6. A plasma processing apparatus according to claim 4, wherein the predetermined relation is $D_1 = (1-3)G$.

7. A plasma processing apparatus according to claim 4, wherein the holding means for holding the substrate includes means for varying the separation distance G.

8. A plasma processing apparatus according to claim 1, wherein the slot plate means includes a plurality of sets of circumferentially extending slots, the plurality of sets of slots being spaced from one another in a radial direction, each set of slots delimiting increasing cross-sectional areas in the outward radial direction so as to enable radiation of resonated microwaves of substantially the same power density from each set of slots.

9. A plasma processing apparatus according to claim 1, wherein the slot plate means includes a plurality of sets of circumferentially extending slots, the plurality of slots being spaced from one another in the radial direction, an inner set of slots being arranged to oppose a portion of the surface of the substrate and an outer set of slots being arranged at a position disposed outwardly with respect to the outer circumference of the surface of the substrate.

10. A plasma processing apparatus according to claim 1, further comprising magnetic field means disposed in said plasma processing chamber means for enabling generation of a magnetic field therein.

11. A plasma processing apparatus according to claim 10, wherein the magnetic field means comprises a magnetic plate member.

12. A plasma processing apparatus according to claim 1, wherein the processing chamber means is configured as a cavity resonator.

13. A plasma processing apparatus according to claim 1, further comprising means for modulating the microwaves introduced into the cavity resonator means.

14. A plasma processing apparatus according to claim 13, wherein the modulating means includes detecting means coupled to the plasma processing chamber means for detecting the plasma therein, and means responsive to the detected output for controlling the microwave generator means for modulating the microwaves supplied to the waveguide means.

15. A plasma processing apparatus according to claim 1, further comprising tuner means coupled to the waveguide means for enabling impedance matching.

16. A plasma processing apparatus according to claim 1, wherein the plasma processing gas introducing means includes a plurality of blow-off ports disposed at a substantially uniform pitch about the plasma processing chamber means at a position disposed outwardly with respect to an outer circumference of the substrate.

17. A plasma processing apparatus according to claim 15, wherein the plurality of blow-off ports are arranged one of above and below the surface of the substrate.

18. A plasma processing apparatus according to claim 1, further comprising means for one of heating and cooling the substrate.

19. A plasma processing apparatus comprising:

microwave generator means for generating microwaves;

waveguide means for supplying microwaves generated by the microwave generator means;

cavity resonator means for resonating the microwaves supplied by the waveguide means;

plasma processing chamber means, the plasma processing chamber means being coupled to the cavity resonator means for receiving resonated microwaves therefrom and for generating a plasma therein, the plasma processing chamber means having means for holding a substrate for plasma processing, means for introducing a plasma processing gas to the plasma processing chamber means, and means for exhausting gas therefrom;

separation plate means for separating the cavity resonator means and the plasma processing chamber means and for enabling resonated microwaves to be transmitted therethrough from the cavity resonator means to the plasma processing chamber means; and slot plate means disposed in the cavity resonator means in opposition to a surface of the substrate for enabling radiation of the resonated microwaves to the plasma processing chamber means through the separation plate means, the slot plate means including at least one set of circumferentially extending slots delimiting a cross-sectional area of the slots of 5-130 cm$^2$ for enabling impedance matching 20. A plasma processing apparatus according to claim 19, wherein the slot plate means includes a plurality of sets of circumferentially extending slots, the plurality of slots being spaced from one another in the radial direction, an inner set of slot being arranged to oppose a portion of the surface of the substrate and an outer set of slots being arranged at a position disposed outwardly with respect to the outer circumference of the surface of the substrate.

21. A plasma processing apparatus according to claim 19, further comprising magnetic field means disposed in said plasma processing chamber means for enabling generation of a magnetic field therein.

22. A plasma processing apparatus according to claim 21, wherein the magnetic field means comprises a magnetic plate member.

23. A plasma processing apparatus according to claim 19, wherein the processing chamber means is configured as a cavity resonator.

24. A plasma processing apparatus according to claim 19, further comprising means for modulating the microwaves introduced into the cavity resonator means.

25. A plasma processing apparatus according to claim 24, wherein the modulating means includes detecting means coupled to the plasma processing chamber means for detecting the plasma therein, and means responsive to the detected output for controlling the microwave generator means for modulating the microwaves supplied to the waveguide means.

26. A plasma processing apparatus according to claim 19, further comprising tuner means coupled to the waveguide means for enabling impedance matching.

27. A plasma processing apparatus according to claim 19, wherein the plasma processing gas introducing means includes a plurality of blow-off ports disposed at a substantially uniform pitch about the plasma processing chamber means at a position disposed outwardly with respect to an outer circumference of the substrate.

28. A plasma processing apparatus according to claim 27, wherein the plurality of blow-off ports are arranged one of above and below the surface of the substrate.

29. A plasma processing apparatus according to claim 19, further comprising means for one of heating and cooling the substrate.

30. A plasma processing apparatus comprising:
microwave generator means for generating microwaves;
waveguide means for supplying microwaves generated by the microwave generator means;
cavity resonator means for resonating the microwaves supplied by the waveguide means;
plasma processing chamber means, the plasma processing chamber means being coupled to the cavity resonator means for receiving resonated microwaves therefrom and for generating a plasma therein, the plasma processing chamber means having means for holding a substrate for plasma processing, means for introducing a plasma processing gas to the plasma processing chamber means, and means for exhausting gas therefrom;
separation plate means for separating the cavity resonator means and the plasma processing chamber means and for enabling resonated microwaves to be transmitted therethrough from the cavity resonator means to the plasma processing chamber means; and
slot plate means disposed in the cavity resonator means in opposition to a surface of the substrate for enabling radiation of the resonated microwaves to the plasma processing chamber means through the separation plate means, the slot plate means including at least one set of circumferentially extending slots having a diameter $D_1$ of a center line of the at least one set of circumferentially extending slots having a predetermined relation to a separation distance G between the separation plate means and the substrate.

31. A plasma processing apparatus according to claim 30, wherein the predetermined relation is $D_1=(0.75-3)G$.

32. A plasma processing apparatus according to claim 30, wherein the predetermined relation is $D_1=(1-3)G$.

33. A plasma processing apparatus according to claim 30, wherein the holding means for holding the substrate includes means for varying the separation distance G.

34. A plasma processing apparatus according to claim 30, further comprising tuner means coupled to the waveguide means for enabling impedance matching.

35. A plasma processing apparatus according to claim 30, wherein the plasma processing gas introducing means includes a plurality of blow-off ports disposed at a substantially uniform pitch about the plasma processing chamber means at a position disposed outwardly with respect to an outer circumference of the substrate.

36. A plasma processing apparatus according to claim 35, wherein the plurality of blow-off ports are arranged one of above and below the surface of the substrate.

37. A plasma processing apparatus according to claim 30, wherein the slot plate means includes a plurality of sets of circumferentially extending slots, the plurality of sets of slots being spaced from one another in a radial direction.

38. A plasma processing apparatus according to claim 30, further comprising means for closing at least a part of at least one set of circumferentially extending slots.

39. A plasma processing apparatus comprising:
microwave generator means for generating microwaves;
waveguide means for supplying microwaves generated by the microwave generator means;
cavity resonator means for resonating the microwaves supplied by the waveguide means;
plasma processing chamber means, the plasma processing chamber means being coupled to the cavity resonator means for receiving resonated microwaves therefrom and for generating a plasma therein, the plasma processing chamber means having means for holding a substrate for plasma processing, means for introducing a plasma processing gas to the plasma processing chamber means, and means for exhausting gas therefrom;
separation plate means for separating the cavity resonator means and the plasma processing chamber means and for enabling resonated microwaves to be transmitted therethrough from the cavity resonator means to the plasma processing chamber means; and
slot plate means disposed in the cavity resonator means in opposition to a surface of the substrate for enabling radiation of the resonated microwaves to the plasma processing chamber means through the separation plate means, the slot plate means including a plurality of sets of circumferentially extending slots, the plurality of sets of slots being spaced from one another in a radial direction, each set of slots delimiting increasing cross-sectional areas in the outward radial direction so as to enable radiation of resonated microwaves of substantially the same power density from each set of slots.

40. A plasma processing apparatus according to claim 39, wherein the slot plate means includes a plurality of sets of circumferentially extending slots, the plurality of slots being from one another in the radial direction, an inner set of slots being arranged to oppose a portion of the surface of the substrate and an outer set of slots being arranged at a position disposed outwardly with respect to the outer circumference of the surface of the substrate.

41. A plasma processing apparatus according to claim 39, further comprising tuner means coupled to the waveguide means for enabling impedance matching.

42. A plasma processing apparatus according to claim 39, wherein the plasma processing gas introducing means includes a plurality of blow-off ports disposed at a substantially uniform pitch about the plasma processing chamber means at a position disposed outwardly with respect to an outer circumference of the substrate.

43. A plasma processing apparatus according to claim 42, wherein the plurality of blow-off ports are arranged one of above and below the surface of the substrate.

44. A plasma processing apparatus comprising:
microwave generator means for generating microwaves;
waveguide means for supplying microwaves generated by the microwave generator means;
cavity resonator means for resonating the microwaves supplied by the waveguide means;
plasma processing chamber means, the plasma processing chamber means being coupled to the cavity resonator means for receiving resonated microwaves therefrom and for generating a plasma therein, the plasma processing chamber means having means for holding a substrate for plasma processing, means for introducing a plasma processing gas to the plasma processing chamber means, and means for exhausting gas therefrom;
separation plate means for separating the cavity resonator means and the plasma processing chamber means and for enabling resonated microwaves to be transmitted therethrough from the cavity resonator means to the plasma processing chamber means; and
means for modulating the microwaves introduced into the cavity resonator means.

45. A plasma processing apparatus according to claim 44, wherein the modulating means includes detecting means coupled to the plasma processing chamber means for detecting the plasma therein, and means responsive to the detected output for controlling the microwave generator means for modulating the microwaves supplied to the waveguide means.

46. A plasma processing apparatus according to claim 44, further comprising tuner means coupled to the waveguide means for enabling impedance matching.

47. A plasma processing apparatus according to claim 44, further comprising magnetic field means disposed in said plasma processing chamber means for enabling generation of a magnetic field therein.

48. A plasma processing apparatus according to claim 44, wherein the magnetic field means comprises a magnetic plate member.

49. A plasma processing apparatus according to claim 44, further comprising slot plate means disposed in the cavity resonator means for enabling radiation of the resonated microwaves to the plasma processing chamber means through the separation plate means, the slot plate means including at least one set of circumferentially extending slots.

* * * * *